United States Patent [19]
Gardner et al.

[11] Patent Number: 5,851,901
[45] Date of Patent: Dec. 22, 1998

[54] METHOD OF MANUFACTURING AN ISOLATION REGION OF A SEMICONDUCTOR DEVICE WITH ADVANCED PLANARIZATION

[75] Inventors: Mark I. Gardner, Cedar Creek; Mark C. Gilmer, Austin, both of Tex.

[73] Assignee: Advanced Micro Devices, Austin, Tex.

[21] Appl. No.: 832,706

[22] Filed: Apr. 11, 1997

[51] Int. Cl.[6] .................................................. H01L 21/76
[52] U.S. Cl. ...................... 438/439; 438/443; 438/452; 438/297
[58] Field of Search ................................ 438/443, 452, 438/425, 439, 297

[56] References Cited

U.S. PATENT DOCUMENTS 5,472,905 12/1995 Paek ........................................ 438/443
5,567,645 10/1996 Ahn et al. ............................... 438/439
5,679,602 10/1997 Lin et al. ................................ 438/443
5,728,622 3/1998 Yu ........................................... 438/452

*Primary Examiner*—Trung Dang
*Attorney, Agent, or Firm*—Merchant, Gould, Smith, Edell, Welter & Schmidt, P.A.

[57] ABSTRACT

A semiconductor device manufacturing method of forming an isolation region of a semiconductor device with high planarization is provided. A semiconductor device is formed by forming a mask over a portion of a semiconductor substrate, the mask defining an exposed portion of the substrate. A first oxide region is grown in the exposed portion of the substrate and a second oxide region is formed over the first oxide region to form a composite oxide region. The mask is removed while leaving the composite oxide region. Spacers may be formed on sidewalls of the mask and removed after growing the first oxide region. The composite oxide region may, for example, form a field oxide region.

34 Claims, 4 Drawing Sheets

METHOD OF MANUFACTURING AN ISOLATION REGION OF A SEMICONDUCTOR DEVICE WITH ADVANCED PLANARIZATION

FIELD OF THE INVENTION

The present invention is directed generally to a method of manufacturing a semiconductor device and, more particularly, to a method of forming an isolation region of a semiconductor device with advanced planarization.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

Semiconductor devices, like the ones mentioned above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

One important step in the formation of semiconductors is the process of electrically isolating adjacent active devices. One known technique for isolating active devices on a semiconductor substrate is LOCOS (for LOCal Oxidation of Silicon) isolation. LOCOS isolation generally involves the formation of a recessed or semi-recessed oxide in the nonactive (or field) areas of the substrate which separate the active devices.

In one particular LOCOS process, a thin silicon dioxide layer, often referred to as a pad oxide layer is grown on the surface of semiconductor substrate. A relatively thick layer of silicon nitride is then deposited over the pad oxide layer. Using a mask and etch process, the pad oxide/nitride layers are then selectively removed to define active regions (generally those regions masked by the pad oxide/nitride layers) and field regions (generally those regions over which the pad oxide/nitride layers have been removed). The nitride layer acts as a mask during subsequent oxide growth. An oxide, typically referred to as a field oxide, is thermally grown in the field regions to a thickness ranging from 0.3 to 1.0 $\mu$m to electrically isolate the active regions. The resultant structure is illustrated in FIG. 1A. The pad oxide layer and nitride masking layer are then removed to expose the active regions of the substrate.

The structure resulting from LOCOS isolation techniques is typically associated with a number of limitations. One limitation in particular is the poor planarity of the resultant surface topography. This limits the maximum resolution of photolithography steps and serves to further impede scaling down of semiconductor devices.

One alternative to LOCOS isolation is trench isolation. Trench isolation generally involves etching shallow trenches in field regions of the substrates and refilling the trenches with a deposited silicon dioxide layer, which is etched back to yield a relatively planar surface. A substrate with isolation regions formed using trench isolation is depicted in FIG. 1B. While trench isolation generally improves the planarity of the surface topography of the device, it also gives rise to other problems. For example, deleterious voids can form in the deposited silicon dioxide. These voids become more pronounced as the trenches become narrower. In addition, it is often difficult to form uniform field oxide profiles over different areas of the device. The methods used to alleviate these problems generally involve further processing steps. Each of these steps, however, adds to the overall cost and time to manufacture a semiconductor device. A more detailed discussion of the LOCOS and trench isolation techniques as well as the advantages and disadvantages resulting therefrom can be found in S. Wolf, *Silicon Processing For The VLSI Era*, Vol. 2: Processing Integration, Chap. 2, pp. 12–66, 1990.

SUMMARY OF THE INVENTION

Generally, the present invention relates to a semiconductor device manufacturing method including formation of an isolation region of a semiconductor device with high planarization.

In one embodiment of the invention, a semiconductor device is formed by forming a mask over a portion of a semiconductor substrate, the mask defining an exposed region of the substrate. A first oxide region is grown in the exposed portion of the substrate, and a second oxide region is formed over the first oxide region to form a composite oxide region. The mask is removed while leaving the composite oxide region.

In another embodiment of the invention, a semiconductor device is formed by forming a mask on a semiconductor substrate. Spacers are formed on sidewalls of the mask. A first oxide region is grown in an area of the substrate adjacent the mask, and a second oxide layer is formed over the first oxide region to form a composite oxide region. The mask and the spacers are removed while leaving the composite oxide region.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
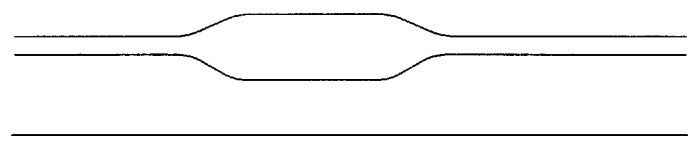
FIG. 1 illustrates one typical MOS semiconductor device structure.
Figure 1B:
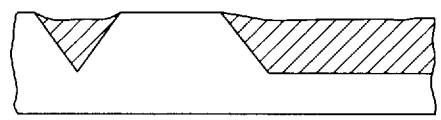

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which employ isolation regions to separate active device regions. While the present invention is not so limited, an appreciation of various aspects of the invention will be gained through a discussion of the fabrication process in connection with the examples provided below.

Figure 2A:
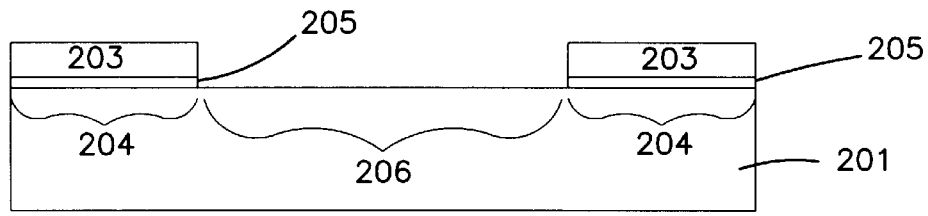
FIGS. 2A–2E illustrate a fabrication process in accordance with one embodiment of the invention.

FIGS. 2A–2E illustrate a process for fabricating an isolation region on a semiconductor substrate with the resultant substrate having a highly planar surface topography. Using known techniques, masks 203 (only two of which are shown) are formed on a substrate 201. The masks 203 are typically insulated from the substrate 201 by a thin insulating layer 205. The insulating layer 205 is typically an oxide, such as $SiO_2$, often referred to as a pad oxide. The resultant structure is illustrated in FIG. 2A. The masks 203 are generally formed from a material selective to oxide, such as a nitride. It will be appreciated that a number of different known fabrication techniques could be used to form the mask structures depicted in FIG. 2A. For example, a thin (50–600 angstroms) layer of silicon dioxide may first be thermally grown on the surface of the substrate 201. A relatively thick (1000–2000 angstroms) layer of silicon nitride which functions as a masking layer may then be deposited over the pad oxide layer. The nitride masking layer and pad oxide layer may then be selectively removed, for example, using well-known etching techniques to form nitride masks.

As should be appreciated, the areas 204 of the substrate 201 beneath the masks 203 generally define active regions of the substrate, e.g., regions of the substrate on which active devices such as bases, collectors, emitters, source/drain regions or gate electrodes are formed. The exposed regions (only one of which is shown) adjacent the masks 203 are generally used to form isolation or field oxide regions which electrically isolate the active regions 204.

Figure 2B:
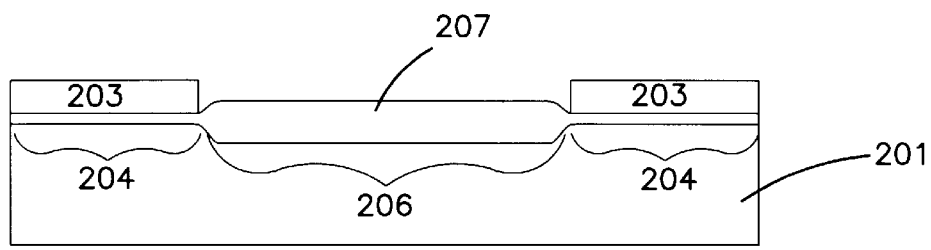

An isolation region is generally formed in the exposed region 206 using a two-step oxide formation process. More particularly, an oxide region 207 is formed in the exposed region 206. The resultant structure is illustrated in FIG. 2B. The oxide region 207 may be formed of a silicon dioxide which is thermally grown, for example, using well-known wet oxidation techniques. The thickness of the oxide region 207 is selected based on the desired penetration of the oxide region 207 into the substrate and in consideration of oxide growth beneath the masks 203. Oxide region thicknesses ranging from 500 to 2000 angstroms would be suitable for many applications. It should be appreciated that the dimensions of the features shown in the Figures are illustrative only and are not necessarily to scale. It should further be appreciated that in some embodiments, a channel stop implant may be performed either prior to or following growth of the oxide region 207 in order to create a channel/stop doping layer under the oxide region 207.

Figure 2C:
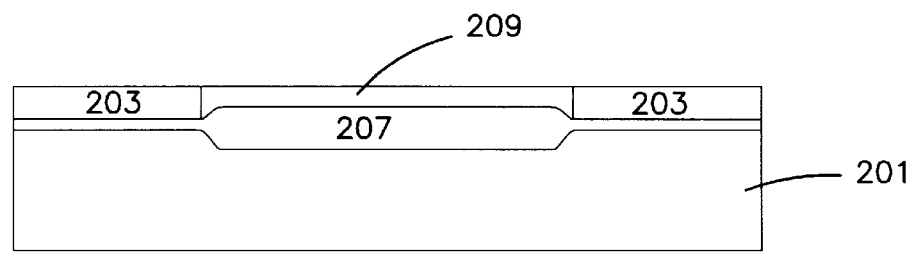

After forming the oxide region 207, a second oxide region 209 is formed over each oxide region 207 to form a composite field oxide region 211. The resultant structure is illustrated in FIG. 2C. While the two oxide regions 207 and 209 are shown separately in FIG. 2C, it should be appreciated that where the two oxide regions are formed from a common material, such as silicon dioxide, the two regions will substantially blend together. The second oxide region 209 may be formed, for example, by depositing an oxide, such as silicon dioxide, over the oxide region 207 and the masks 203 and etching back the oxide layer to provide a relatively planar field oxide region surface and to expose the masks 203, as illustrated in FIG. 2C. The oxide deposition and etching may, for example, be done using well-known chemical vapor deposition and polishing techniques. The thickness of the deposited oxide layer is generally selected in consideration of the mask thickness. Oxide layer thicknesses of 5000 to 15000 angstroms would be suitable for many applications. In alternate embodiments, the field oxide region 211 may be overpolished to provide a relatively planar field oxide region surface which is recessed with respect to the upper surface of the masks 203. This allows for a more planar surface topography after the removal of the masks 203 and pad oxides 205, as will be discussed below.

Figure 2D:
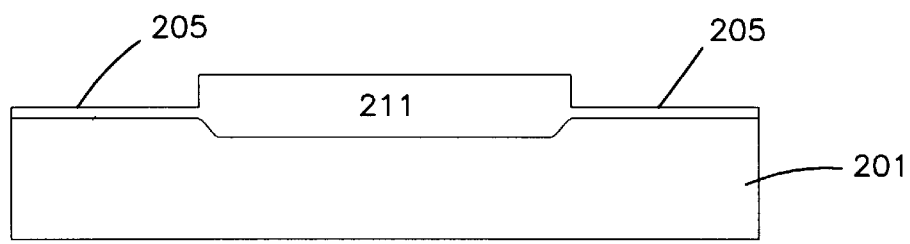
Figure 2E:
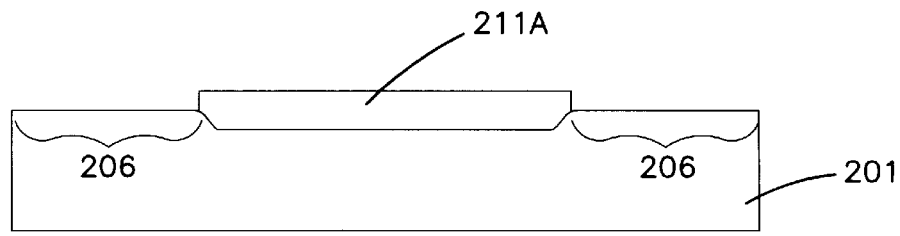

The masks 203 are stripped to expose the pad oxides 205. The resultant structure is illustrated in FIG. 2D. The masks 203 may be removed using well-known etching techniques, such as wet-chemical etching. The pad oxides 205 may then be removed to expose the surface of the active regions 204 of the substrate 201. The resultant structure is shown in FIG. 2E.

The pad oxides 205 may be removed by, for example, using well known etching techniques, such as wet-chemical etching. As the pad oxides 205 are removed, an upper portion of each field oxide region 211 may be removed as well. The resulting structure includes a field oxide region 211A having a relatively planar upper surface and a minimal step height between the field oxide region 211A and the adjacent substrate surfaces. In embodiments, using overetching of the field oxide region 211, this step height is further reduced. Fabrication may continue with conventional fabrication processes to complete the device structure. For example, source/drain regions and gate electrodes may be formed in the active regions 204, followed by silicidation, contact formation, and so forth.

Using the above process, field oxide regions may be formed on a semiconductor substrate with the resultant substrate having a highly planarized surface topography. The highly planarized topography results from the minimal step heights between field oxide regions and the adjacent substrate surface where active regions are formed. The surface topography of a device using the above process is more planar than those formed using conventional LOCOS isolation techniques and avoids the numerous process steps involved in forming a reliable and planar surface topography using trench isolation techniques.

Figure 3A:
FIGS. 3A–3F illustrate a fabrication process in accordance with another embodiment of the invention.
Figure 3B:
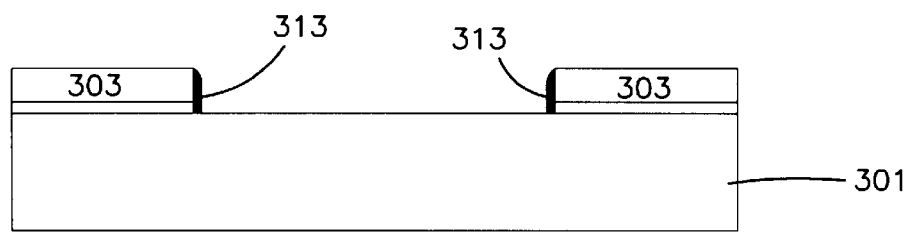

FIGS. 3A–3F illustrate another exemplary process for fabricating an isolation region on a semiconductor substrate. In a similar manner as discussed above, masks 303 (only two of which are shown) are formed on a substrate 301 as depicted in FIG. 3A. Spacers 313 are formed on the sidewalls of the masks 303, as illustrated in FIG. 3B. The spacers 313, in the exemplary embodiment, are formed of the same material as the masks 303. However, the invention is not so limited. For example, both the spacers 313 and masks 303 may be formed of a nitride. This enables the masks 303 and the spacers 313 to be removed in the same process step, as discussed below. The spacers 313 may be formed in a wide variety of manners. For example, the spacers 313 may be formed by depositing a layer of silicon nitride and selectively removing the silicon nitride layer using, for example, well-known chemical vapor deposition and etching techniques.

The spacers 313 generally seal the sidewalls of the masks 303 and reduce the bird's beak effect resulting from growth of an oxide in the isolation region 306. The width of the spacers 313 generally define the width of the sealed interface. Spacer widths are suitably selected in consideration of subsequent oxide growth beneath the spacers such that the active regions of the substrate are not exposed to silicon nitride. Spacer widths of 50 to 500 angstroms are suitable for many applications.

As discussed above, the areas 304 of the substrate 301 covered by the masks 303 generally define active regions of the substrate, e.g., regions of the substrate on which active devices are formed. The exposed regions (only one of which is shown) adjacent the masks 303 are generally used to form field oxide or isolation regions.

Figure 3C:
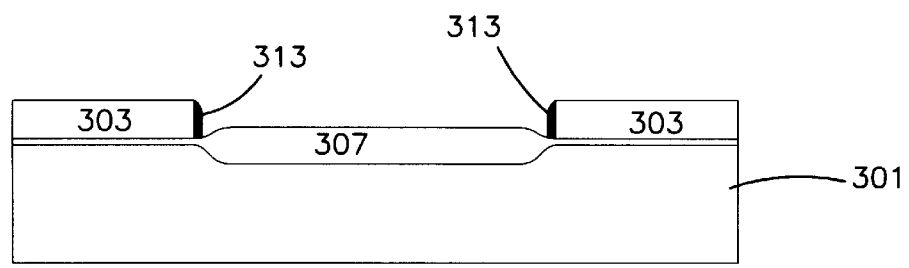

A field oxide region is formed in the exposed region 306 by initially forming an oxide region 307 in the substrate region 306. The resultant structure is illustrated in FIG. 3C. The oxide region 307 may be formed of a silicon dioxide which is thermally grown, for example, using well-known wet oxidation techniques. The thickness of the oxide region 307 is selected based on the desired penetration of the oxide region 307 into the substrate and in consideration of oxide growth beneath the spacers 313. Oxide region thicknesses ranging from 500 to 2000 angstroms would be suitable for many applications. It should be appreciated that in some embodiments, a channel stop implant may be performed prior to growing the oxide regions 307 in order to create a channel/stop doping layer under the oxide region 307.

Figure 3D:
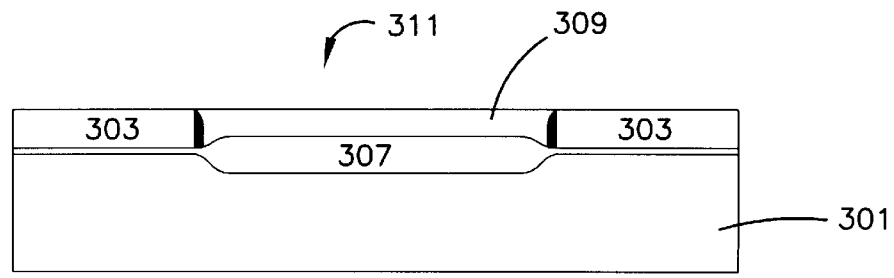

After forming the oxide region 307, a second oxide region 309 is formed over each oxide region 307 to form a composite field oxide region 311. The resultant structure is illustrated in FIG. 3D. The second oxide region 309 may be formed, for example, by depositing an oxide, such as silicon dioxide, over the oxide region 307 and the masks 303 and etching back the oxide layer to provide a relatively planar field oxide surface and expose the masks 303, in a similar manner as discussed above. In alternate embodiments, the composite oxide region 311 may be over-etched to provide a relatively planar field oxide surface which is recessed with respect to the upper surface of the masks 303.

Figure 3E:
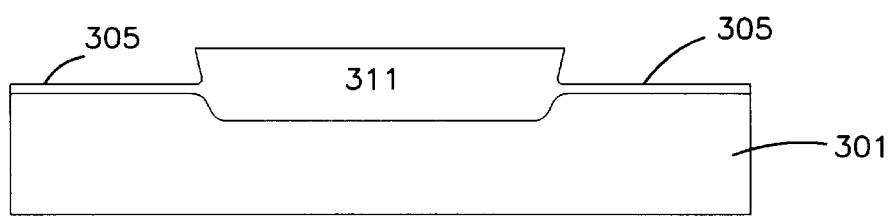
Figure 3F:
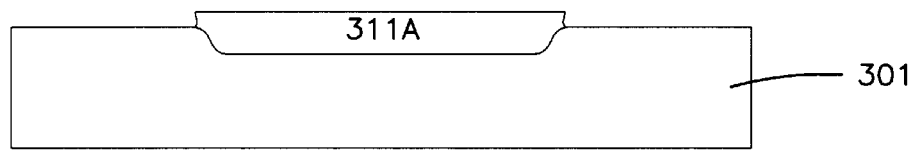

The masks 303 and spacers 313 are stripped to expose the pad oxides 305. The resultant structure is illustrated in FIG. 3E. As noted above, the masks 303 and spacers 313 may be removed during the same process step where the two structures are formed of the same or similar material, such as nitride. The masks 303 and spacers 313 may be removed using, for example, well-known etching techniques such as wet-chemical etching. The pad oxides 305 may then be removed to expose the surface of the active regions 304 of the substrate 301 in a similar manner as discussed above. The resultant structure is shown in FIG. 3F.

Fabrication may continue with conventional fabrication processes to complete the device structure. For example, source/drain regions and gate electrodes may be formed in the active regions 304, followed by silicidation, contact formation, and so forth to form MOS transistors.

In an alternate embodiment, the spacers 313 may be removed prior to forming the second oxide region 309. For example, the spacers 313 may be made of a material selective to both the oxide etchant and the etchant for the masks 303. After the first oxide region 307 is formed, the spacers may be selectively removed while leaving the masks 303 and the oxide region 307. The second oxide region 309 may then be formed, and the masks 303 subsequently removed.

Using the above process, field oxide regions may be formed on a semiconductor substrate with the resultant substrate having a highly planarized surface topography. The surface topography of a device using the above process is more planar than those formed using conventional LOCOS isolation techniques and avoids the numerous process steps involved in forming a reliable and planar surface topography using trench isolation techniques. Moreover, by using oxide selective spacers to seal the sidewalls of the masks, bird's beak effects are reduced and device reliability and performance is enhanced.

As noted above, the present invention is applicable to the fabrication of a number of different devices where an isolation region is formed in a substrate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:
    forming a mask over a portion of a substrate to define an exposed region;
    forming spacers from a nitride on sidewalls of the mask prior to growing a first oxide;
    growing the first oxide in the exposed region of the substrate;
    forming a second oxide region over the first oxide region to form a composite oxide region; and
    selectively removing the mask while leaving at least a portion of the composite oxide region.

2. The process of claim 1, wherein forming the mask includes:
    forming an insulating layer on the surface of the substrate;
    forming a masking layer on the insulating layer; and
    selectively removing portions of the masking layer and the insulating layer.

3. The process of claim 2, wherein removing the mask includes selectively removing the mask while leaving the composite oxide region and the insulating layer.

4. The process of claim 3, further including removing the insulating layer to expose a portion of the substrate beneath the insulating layer.

5. The process of claim 4, further including removing a portion of the composite oxide region while removing the insulating layer.

6. The process of claim 1, wherein the mask comprises a nitride.

7. The process of claim 1, wherein the oxide region is grown to a thickness ranging from 500 to 2000 angstroms.

8. The process of claim 1, wherein forming the second oxide region includes:
    depositing an oxide layer over the first oxide region and the mask; and
    planarizing the oxide layer to expose the mask.

9. The process of claim 8, wherein the oxide layer is deposited by chemical vapor deposition.

10. The process of claim 8, wherein oxide layer comprises silicon dioxide.

11. The process of claim 8, wherein the oxide layer is selectively removed using etching.

12. The process of claim 1, wherein forming the second oxide layer over the first oxide region to form the composite oxide region includes etching the composite oxide region to planarize the surface of the composite oxide region.

13. The process of claim 12, wherein the composite oxide region is etched to the surface of the mask.

14. The process of claim 12, wherein the composite oxide region is etched beneath the surface of the mask.

15. The process of claim 1, wherein the spacers are formed with a thickness ranging from about 50 to 500 angstroms.

16. The process of claim 1, further comprising removing the spacers after formation of the composite oxide region.

17. The process of claim 1, further comprising removing the spacers before formation of the composite oxide region.

18. The process of claim 1, wherein the first and second oxide regions are formed of a silicon dioxide.

19. The process of claim 1, wherein the masked portion of the substrate includes an active region.

20. The process of claim 1, wherein the composite oxide region forms a field oxide region.

21. The process of claim 1, further including forming a channel stop beneath the first oxide after growing the first oxide.

22. The process of claim 1, further including forming a channel stop beneath the first oxide before growing the first oxide.

23. A process of forming a semiconductor device, comprising:
    forming a mask over a portion of a substrate to define an exposed region;
    forming oxidation-resistant spacers on sidewalls of the mask prior to growing a first oxide region;
    growing the first oxide region in the exposed portion of the substrate;
    forming a second oxide region over the first oxide region to form a composite oxide region;
    removing the spacers; and
    removing the mask while leaving the composite oxide region.

24. The process of claim 23, wherein the spacers are removed prior to forming the second oxide region.

25. The process of claim 23, wherein the spacers are removed after forming the second oxide region.

26. The process of claim 23, wherein the spacers are removed as part of the process of removing the mask.

27. A process of forming a semiconductor device, comprising:
    forming a mask over an active region of a substrate;
    forming spacers, selective to oxide, on sidewalls of the mask prior to growing a silicon dioxide region;
    growing the silicon dioxide region in a field area of the substrate adjacent the mask;
    depositing a silicon dioxide layer over the silicon dioxide region and the mask;
    planarizing the silicon dioxide layer to expose the mask; and
    removing the mask while leaving the planarized silicon dioxide layer;
    wherein the spacers are removed by etching before or after depositing the silicon dioxide layer.

28. The process of claim 1, wherein the spacers are removed while selectively removing the mask.

29. The process of claim 23, wherein the spacers are formed from a nitride.

30. The process of claim 29, wherein the spacers have a width ranging from about 50 to 500 angstroms.

31. The process of claim 27, wherein the spacers are removed while removing the mask.

32. The process of claim 27, wherein the spacers are formed from a nitride.

33. A process of forming a semiconductor device, comprising:
    forming a mask over a portion of a substrate to define an exposed region;
    forming a spacer, selective to oxide, on a sidewall of the mask prior to growing a first oxide;
    growing the first oxide in the exposed region of the substrate;
    forming a second oxide region over the first oxide region to form a composite oxide region; and
    selectively removing the mask while leaving at least a portion of the composite oxide region;
    wherein the spacer is removed before or after forming the composite oxide region.

34. The process of claim 33, wherein the spacer is formed from a nitride.

* * * * *